(12) United States Patent
Quintanilha et al.

(10) Patent No.: US 9,915,879 B2
(45) Date of Patent: Mar. 13, 2018

(54) SUBSTRATE AND PATTERNING DEVICE FOR USE IN METROLOGY, METROLOGY METHOD AND DEVICE MANUFACTURING METHOD

(71) Applicant: ASML Netherlands B.V., Veldhoven (NL)

(72) Inventors: Richard Quintanilha, Eindhoven (NL); Willem Marie Julia Marcel Coene, Geldrop (NL)

(73) Assignee: ASML Netherlands B.V., Veldhoven (NL)

( * ) Notice: Subject to any disclaimer, the term of this patent is extended or adjusted under 35 U.S.C. 154(b) by 129 days.

(21) Appl. No.: 14/710,443

(22) Filed: May 12, 2015

(65) Prior Publication Data
US 2015/0331336 A1 Nov. 19, 2015

(30) Foreign Application Priority Data
May 13, 2014 (EP) .................................. 14168067

(51) Int. Cl.
G03B 27/58 (2006.01)
G03F 7/20 (2006.01)

(52) U.S. Cl.
CPC ...... G03F 7/70633 (2013.01); G03F 7/70683 (2013.01)

(58) Field of Classification Search
CPC .................. G03F 7/70633; G03F 7/70683
See application file for complete search history.

(56) References Cited

U.S. PATENT DOCUMENTS 6,453,002 B1   9/2002   Mazor et al.
6,816,568 B2  11/2004   Oshino
(Continued)

FOREIGN PATENT DOCUMENTS

JP   H05-047631 A   2/1993
JP   2009-147370 A  7/2009
(Continued)

OTHER PUBLICATIONS

Adel, M., et al., "Optimized Overlay Metrology Marks: Theory and Experiment," IEEE Transactions on Semiconductor Manufacturing, vol. 17, No. 2, May 2004; pp. 166-179.
(Continued)

Primary Examiner — Deoram Persaud
(74) Attorney, Agent, or Firm — Sterne, Kessler, Goldstein & Fox P.L.L.C.

(57) ABSTRACT

A pattern from a patterning device is applied to a substrate by a lithographic apparatus. The applied pattern includes product features and metrology targets. The metrology targets include large targets which are for measuring overlay using X-ray scattering and small targets which are for measuring overlay by diffraction of visible radiation. Some of the smaller targets are distributed at locations between the larger targets, while other small targets are placed at the same locations as a large target. By comparing values measured using a small target and large target at the same location, parameter values measured using all the small targets can be corrected for better accuracy. The large targets can be located primarily within scribe lanes while the small targets are distributed within product areas.

14 Claims, 7 Drawing Sheets

(56) References Cited

U.S. PATENT DOCUMENTS

| | | | |
|---|---|---|---|
| 7,481,579 B2 | 1/2009 | Yokhin et al. | |
| 9,069,264 B2 * | 6/2015 | Warnaar | G03F 1/44 |
| 2003/0223630 A1 * | 12/2003 | Adel | G03F 7/705 |
| | | | 382/145 |
| 2004/0114143 A1 | 6/2004 | Van Haren et al. | |
| 2006/0141374 A1 | 6/2006 | Van Bilsen | |
| 2007/0076205 A1 * | 4/2007 | Schulz | G03F 7/70633 |
| | | | 356/401 |
| 2007/0224518 A1 | 9/2007 | Yokhin et al. | |
| 2010/0123886 A1 * | 5/2010 | Bijnen | G03F 9/7003 |
| | | | 355/53 |
| 2010/0328655 A1 | 12/2010 | Den Boef | |
| 2011/0027704 A1 | 2/2011 | Cramer et al. | |
| 2011/0043791 A1 | 2/2011 | Smilde et al. | |
| 2012/0044470 A1 | 2/2012 | Smilde et al. | |
| 2012/0123581 A1 | 5/2012 | Smilde et al. | |
| 2013/0059240 A1 | 3/2013 | Van Der Schaar et al. | |
| 2013/0258310 A1 | 10/2013 | Smilde et al. | |
| 2013/0271740 A1 | 10/2013 | Quintanilha | |
| 2013/0304424 A1 | 11/2013 | Bakeman et al. | |
| 2014/0019097 A1 | 1/2014 | Bakeman et al. | |
| 2015/0323471 A1 * | 11/2015 | Sapiens | G01N 21/9501 |
| | | | 356/73 |
| 2016/0003609 A1 * | 1/2016 | Shchegrov | G03F 7/705 |
| | | | 356/625 |
| 2016/0141193 A1 * | 5/2016 | Pandev | G06N 99/005 |
| | | | 702/81 |
| 2016/0274472 A1 * | 9/2016 | Mathijssen | C03F 7/70466 |
| 2016/0282282 A1 * | 9/2016 | Quintanilha | G01N 21/8806 |
| 2016/0327871 A1 * | 11/2016 | Nooitgedagt | G03F 7/70466 |

FOREIGN PATENT DOCUMENTS

| | | |
|---|---|---|
| JP | 2012-094915 A | 5/2012 |
| WO | WO 2009/078708 A1 | 6/2009 |
| WO | WO 2009/106279 A1 | 9/2009 |
| WO | WO 2013/178422 A1 | 12/2013 |

OTHER PUBLICATIONS

"Archer Series Overlay Metrology Systems," KLA-Tencor, accessed at http://www.kla-tencor.com/Metrology/archer-series.html on Aug. 10, 2015; 2 pages.

"N8 Horizon Overview," Bruker Corporation, accessed at https://www.bruker.com/products/x-ray-diffraction-and-elemental-analysis/x-ray-diffraction/n8-horizon/overview.html on Aug. 10, 2015; 1 page.

Shvyd'Ko, Y.V., et al., "High-reflectivity high-resolution X-ray crystaloptics with diamonds," Nature Physics, vol. 6, Mar. 2010: pp. 196-199.

"Small-Angle X-ray Scattering," Bruker Corporation, accessed at https://www.bruker.com/products/x-ray-diffraction-and-elemental-analysis/small-angle-x-ray-scattering/saxs/small-angle-scattering.html on Aug. 10, 2015; 1 page.

"Small-angle X-ray scattering," accessed at https://en.wikipedia.org/wiki/Small-angle_X-ray_scattering on Aug. 10, 2015; 4 pages.

"X-ray," accessed at https://en.wikipedia.org/wiki/X-ray on Aug. 10, 2015; 16 pages.

"Xeuss 2.0, the SAXS/WAXS laboratory beamline," Xenocs, accessed at https://www.xenocs.com/en/solutions/xeuss-saxs-waxs-laboratory-beamline on Aug. 10, 2015; 1 page.

International Preliminary Report on Patentability and Written Opinion of the International Searching Authority directed to related International Patent Application No. PCT/EP2015/058238, dated Nov. 15, 2016; 7 pages.

Schulz, B., et al., "Meeting overlay requirements for future technology nodes with in-die overlay metrology," Metrology, Inspection, and Process Control for Microlithography XXI, Proceedings of SPIE, vol. 6518, 2007; pp. 65180E-1 to 65180E-11.

International Search Report directed to related International Pattent Application No. PCT/EP2015/058238, dated Jul. 14, 2015; 2 pages.

* cited by examiner

SUBSTRATE AND PATTERNING DEVICE FOR USE IN METROLOGY, METROLOGY METHOD AND DEVICE MANUFACTURING METHOD

CROSS REFERENCE TO RELATED APPLICATIONS

This application claims benefit of EP Patent Application No. 14168067, filed on May 13, 2014.

BACKGROUND

Field of the Invention

The present invention relates to methods and apparatus for metrology usable, for example, in the manufacture of devices by lithographic techniques and to methods of manufacturing devices using lithographic techniques. Methods of measuring overlay are described, as a particular application of such metrology.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer).

In lithographic processes, it is desirable frequently to make measurements of the structures created, e.g., for process control and verification. Various tools for making such measurements are known, including scanning electron microscopes (SEM), which are often used to measure critical dimension (CD), and specialized tools to measure overlay, the accuracy of alignment of two layers in a device. Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target structure by iterative approaches such as rigorous coupled wave analysis or finite element methods; library searches; and principal component analysis. Compared with SEM techniques, optical scatterometers can be used with much higher throughput, on a large proportion or even all of the product units.

The targets used by conventional scatterometers are relatively large, e.g., 40 µm by 40 µm, gratings and the measurement beam generates a spot that is smaller than the grating (i.e., the grating is underfilled). In order to reduce the size of the targets, e.g., to 10 µm by 10 µm or less, e.g., so they can be positioned in amongst product features, rather than in the scribe lane, so-called "small target" metrology has been proposed, in which the grating is made smaller than the measurement spot (i.e., the grating is overfilled). These targets can be smaller than the illumination spot and may be surrounded by product structures on a wafer. Typically small targets are measured using dark field scatterometry in which the zeroth order of diffraction (corresponding to a specular reflection) is blocked, and only higher orders processed. Examples of dark field metrology can be found in international patent applications WO 2009/078708 and WO 2009/106279. Diffraction based overlay measurement by dark field imaging is described in US patent application US20100328655A. Further developments of the technique have been described in published patent publications US20110027704A, US20110043791A, US20120044470A US20120123581A, US20130258310A, US20130271740A, and WO2013178422. Multiple gratings can be measured in one image, using a composite grating target. The contents of all these applications are also incorporated herein by reference. The above documents are all hereby incorporated by reference in their entirety. Other types of target and measurement, including image-based metrology are also available.

By placing the target in among the product features, it is hoped to increase accuracy of measurement because the smaller target is affected by process variations in a more similar way to the product features and because less interpolation may be needed to determine the effect of a process variation at the actual feature site. Whether diffraction-based or image based, optical measurements of overlay targets have been very successful in improving overlay performance in mass production.

As technology develops, however, overlay specifications become ever tighter. One limitation of current methods is that they are made with optical wavelengths, for which the dimensions of target features are necessarily made much greater than the typical dimensions of real product features. For example, grating pitches may be hundreds of nanometers, which is at least ten times greater than the smallest product features. Consequently, the overlay measurement results from optical targets are not directly representative of overlay within the product features. One could consider to improve the resolution and accuracy by using shorter wavelength radiation, similar in wavelength to the product features pitch. Unfortunately, for wavelengths shorter than around 200 nm, the product materials are not transparent anymore, and the instrument would not be able to "see" the bottom grating. The sensitivity to overlay therefore drops with shorter wavelength.

As an alternative to optical inspection methods, it has also been considered to use X-rays to measure overlay in a semiconductor device. One technique is known as transmissive small angle X-ray scattering or T-SAXS. A T-SAXS apparatus applied to measurement of overlay is disclosed in US 2007224518A (Yokhin et al, Jordan Valley), and the contents of that application are incorporated herein by reference. T-SAXS uses X-rays of wavelength less than 1 nm, and so targets for T-SAXS can be made of product-like features. Unfortunately, T-SAXS signals tend to be very weak, especially when the target size is small. Therefore the measurements tend to be too time-consuming for use in high-volume manufacturing. While T-SAXS apparatus can be used to measure targets small enough to be considered for placement among the product features. Unfortunately, the small target size requires a small spot size and consequently even longer measurement times.

SUMMARY OF THE INVENTION

The invention aims to enable the use of small target metrology to measure parameters for example at locations within product areas on a semiconductor substrate, while improving the accuracy with which those measurements represent parameters of product features.

According to a first aspect of the present invention, there is provided a substrate having one or more product features formed on it and distributed over the substrate, and a plurality of metrology targets adapted for use in measuring a parameter of performance of a lithographic process by which said product patterns have been applied to the substrate, wherein the metrology targets include:
- a first set of targets for measuring said parameter;
- a second set of targets for measuring the same parameter, wherein a first subset of the first set of targets are distributed substantially at first locations across the substrate where targets of the second set are also located, and wherein a second subset of the first set of targets are distributed at second locations additional to the first locations, and
- wherein the first set of targets comprise principal features having a size many times greater than the smallest of said product features and the second set of targets comprise principal features of size similar to the smallest of said product features including features,
- whereby said parameter can be measured at each of said first locations by using radiation of a wavelength longer than 150 nm to inspect a target of the first set and using X-radiation to inspect a target of the second set.

The targets of both first and second sets may each comprise one or more periodic structures such as gratings. The gratings of the targets of the first set may have a pitch (spatial period) greater than 100 nm, for example, or greater than 200 nm. The size of the principal features can be defined without excluding embodiments where those features contain within them sub-structures that may be the same as or closer in scale to the product features.

The radiation for measurement of the first set of targets may be in the visible range, or in the UV or DUV range. UV and DUV wavelengths do not penetrate through multiple layers and so might not be so suitable for measuring overlay between features made in multiple layers. For other properties of a structure, such as critical dimension (CD), or overlay within a multiple-patterned layer, only a single layer needs to be inspected and the lack of penetration may not be an obstacle.

The X-radiation may have for example a wavelength less than 1 nm, or less than 0.2 nm. X-rays are often characterized in terms of photon energy rather than wavelength. Expressed in this way, the X-radiation may have an energy higher than 13 keV or higher than 15 keV.

It is noted that US 20130059240 proposes to use a combination of large targets and small targets to improve accuracy of overlay measurements made using an optical scatterometer. However, both the large targets and the small targets in that case have the same form and feature size, and are measured by different branches within the same optical instrument. Accordingly that proposal does not address the problem of accurately measuring overlay for product-like features.

The parameter may be overlay, and each target may be an overlay grating formed in two or more patterning steps. In some embodiments of the invention, the product features are arranged in product areas separated by scribe-lanes, and the targets of the second set are located primarily within the scribe-lanes, while the targets of the first set are distributed within product areas. The targets of the first set may be more numerous than those of the second set, while those of the second set each occupy a greater area.

The expression "product features" in the present disclosure is not intended to be limited to product features in their final form in a functional, manufactured device, but includes precursors of such features, for example portions of photosensitive resist material that have been exposed to record a pattern, prior to development, etching etc. that will turn the pattern into physical product features. In measuring overlay between two layers, for example, physical product features that have been etched into an underlying layer may be compared with product features that exist as a latent image or in a developed form in a resist layer, prior to forming the functional features that will be present in a finished semiconductor device or other product being manufactured.

The invention further provides a method of measuring a parameter of performance of a lithographic process by which product features have been applied to a substrate, the method comprising:
  (a) simultaneously with applying said product features to said substrate, applying a plurality of metrology targets, the metrology targets including a first set of targets and a second set of targets which are for measuring the same parameter, wherein a first subset of the first set of targets are distributed substantially at first locations across the substrate where targets of the second set are also located, and wherein a second subset of the first set of targets are distributed at second locations additional to the first locations;
  (b) illuminating at least one target of the first subset of the first set of targets with radiation of wavelength longer than 150 nm, detecting radiation diffracted or reflected by said targets and processing signals representing said radiation to determine a first value for said parameter at a corresponding one of said first locations;
  (c) irradiating a target of the second set at the same first location with X-radiation, detecting radiation scattered by said target of the second set and processing signals representing said radiation to determine a second value for said parameter at said first location;
  (d) determining a correction for parameter values measured using said first set of targets, based on a comparison between the first and second values measured at the same first location.

The invention further provides a device manufacturing method comprising:
  transferring a functional device pattern from a patterning device onto a substrate using a lithographic process while simultaneously transferring patterns defining first and second sets of metrology targets to the substrate;
  measuring the metrology targets as applied to the substrate to determine a value for one or more parameters of the lithographic process; and
  applying a correction in subsequent operations of the lithographic process in accordance with the results of said metrology,
  wherein the metrology targets include a first set of targets and a second set of targets which are for measuring the same parameter, wherein a first subset of the first set of targets are distributed substantially at first locations across the substrate where targets of the second set are also located, and wherein a second subset of the first set of targets are distributed at second locations additional to the first locations; and
  wherein the step of measuring the metrology targets includes determining a value for said parameter at one or more of said second locations by a method according to the present invention as set forth above.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example, with reference to the accompanying drawings in which.

DETAILED DESCRIPTION

Before describing embodiments of the invention in detail, it is instructive to present an example environment in which embodiments of the present invention may be implemented.

Figure 1:
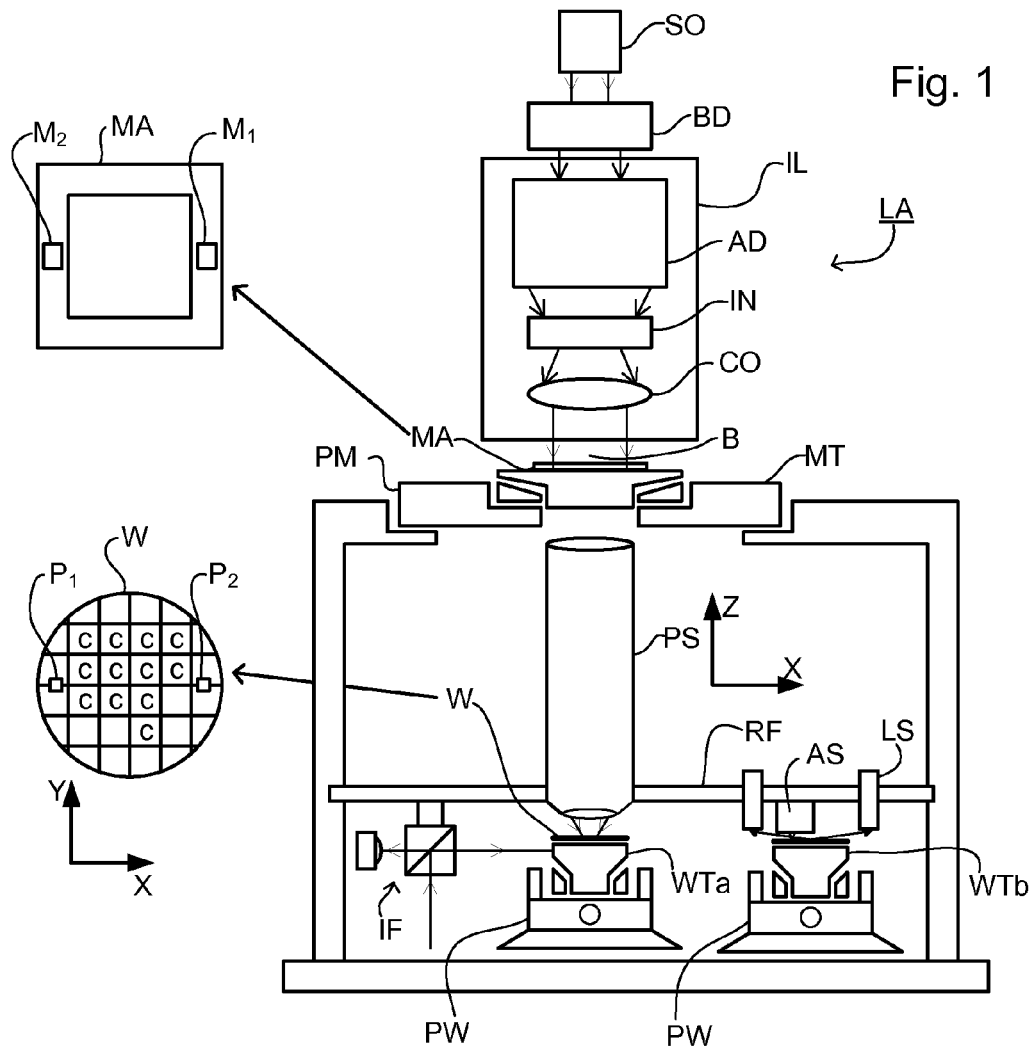
FIG. 1 depicts a lithographic apparatus according to an embodiment of the invention.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; two substrate tables (e.g., a wafer table) WTa and WTb each constructed to hold a substrate (e.g., a resist coated wafer) W and each connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W. A reference frame RF connects the various components, and serves as a reference for setting and measuring positions of the patterning device and substrate and of features on them.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix. The term "patterning device" can therefore also be interpreted as referring to a device storing, in digital form, information defining patterns to be realized with such a programmable patterning device.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus illustrated for the sake of example is of a type having two (dual stage) or more substrate tables WTa and WTb (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may for example include an adjuster AD for adjusting the angular intensity distribution of the radiation beam, an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa or WTb can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment mark may also be included within dies, in amongst the device features, in which case it is desirable that the markers be as small as possible and not require any different imaging or process conditions than adjacent features.

The depicted apparatus could be used in a variety of modes. In a scan mode, the patterning device support (e.g., mask table) MT and the substrate table WTa (or WTb) are scanned synchronously while a pattern imparted to the radiation beam is projected onto a target portion C (i.e., a single dynamic exposure). The speed and direction of the substrate table WTa relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WTa is moved or scanned.

Combinations and/or variations on the above described modes of use or entirely different modes of use may also be employed.

Lithographic apparatus LA is of a so-called dual stage type which has two substrate tables WTa, WTb and two stations—an exposure station and a measurement station—between which the substrate tables can be exchanged. While one substrate on one substrate table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS. This enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations, relative to reference frame RF.

Figure 2:
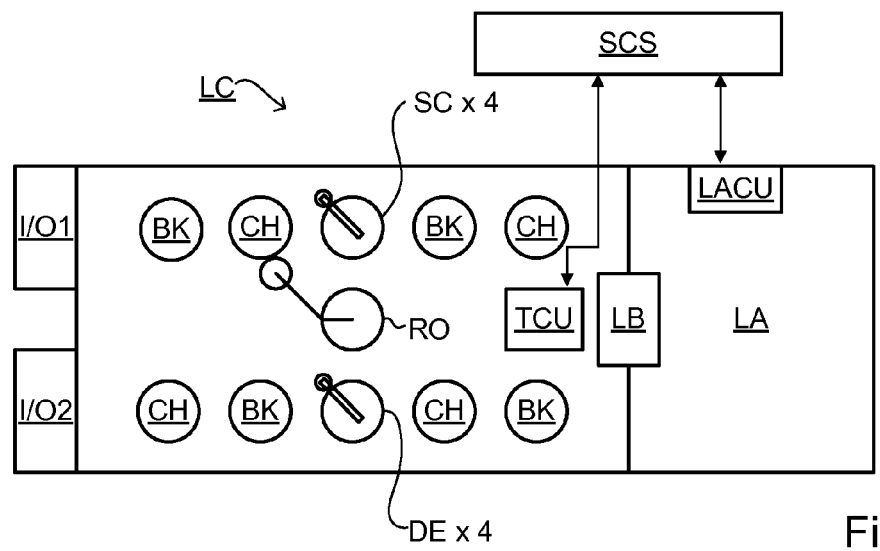
FIG. 2 depicts a lithographic cell or cluster according to an embodiment of the invention.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

Figure 3:
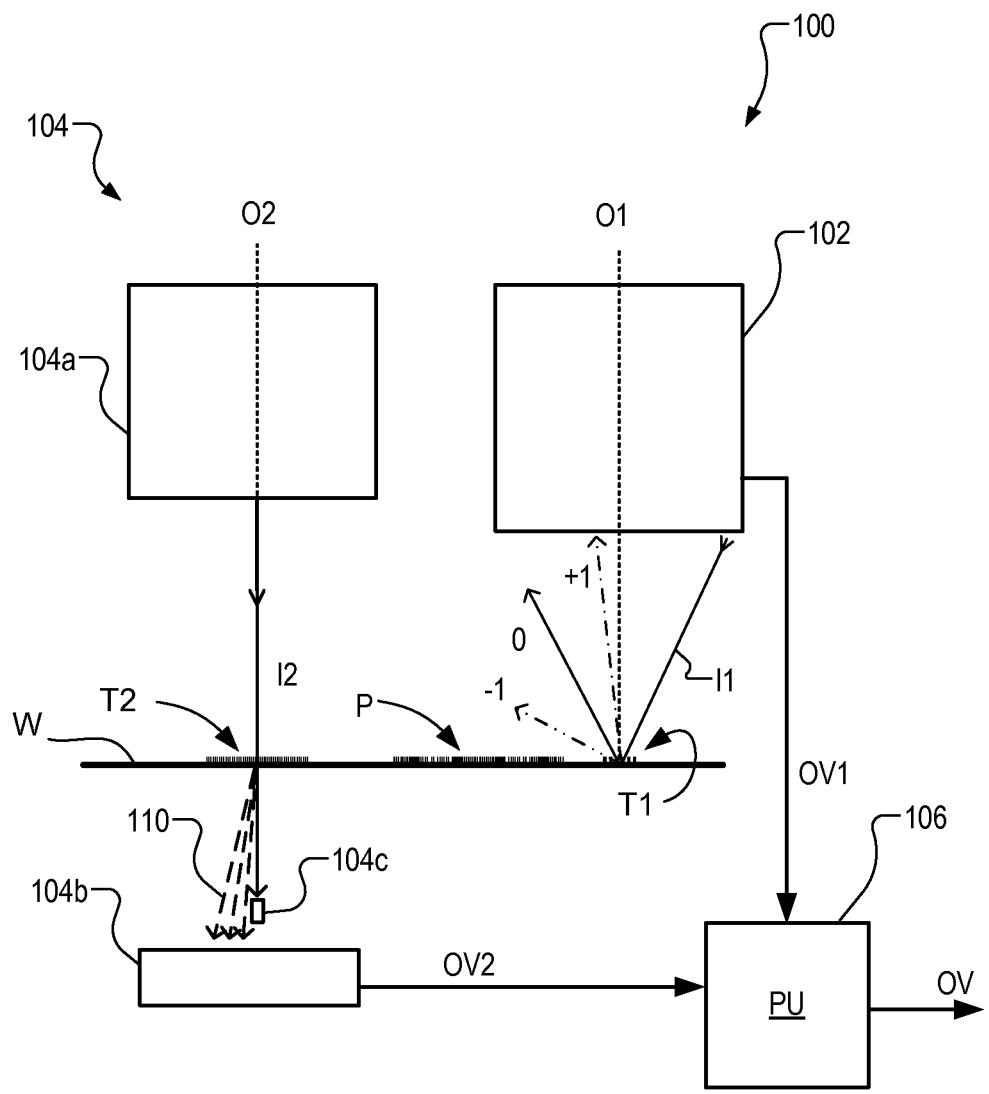
FIG. 3 depicts a metrology system comprising an X-ray metrology apparatus and optical metrology apparatus measuring different targets on a substrate in accordance with an embodiment of the present invention.

FIG. 3 illustrates a metrology system for use in measuring parameters of substrates processed by the lithographic apparatus LA in the lithographic cell LC. The metrology system can be used in conjunction with other manufacturing systems, not only the one illustrated in FIGS. 1 and 2. A particular aim is to measure overlay, but other parameters may be measured but suitable adaptation of the techniques disclosed herein.

A metrology system useful in an embodiment of the invention, is shown in FIG. 3. The metrology system 1 comprises a first metrology apparatus 102, which is of an optical type, and a second metrology apparatus 104, which uses X-rays. As illustrated, apparatus 102 measures properties of a first metrology target T1 that has been formed on a substrate W by a lithographic process. A first optical axis, which in practice has several branches throughout the apparatus, is represented simply by a dotted line O1. A illuminating radiation from a light source is formed into a spot on target T1 by an illumination optical system within the apparatus 102. For the sake of illustration, one incident ray I1 is represented in the diagram. The illuminating radiation is reflected and diffracted by target T1 as represented by rays 0, +1 and −1. At least some of these rays are collected by a detecting optical system in apparatus 102 and are processed to obtain a first overlay measurement OV1.

Apparatus 104 measures properties of a second metrology target T2 formed on the same substrate by the same lithographic process as target T1. A second optical axis is represented simply by a dotted line O2. A illumination system 104a provides a beam of X-ray radiation represented by ray I2 form an irradiation spot on target T2. The radiation passes through target T2 and through substrate W. Some of the radiation is diffracted to different angles and detected in a detection system 104b of apparatus 104. The angles are exaggerated in this schematic diagram, and very small angles may be seen in practice. Signals detected by detection system 104b can be processed to obtain a measurement OV2 of overlay in target T2.

Targets T1 and T2 are formed on the same substrate as product features P, and by the same process. Therefore by providing and measuring targets T1, T2 metrology system 100 is able to measure indirectly overlay of the product features P. As will be illustrated further below, multiple targets T1 and T2 are formed at locations distributed across the substrate. As will be appreciated, a typical product made by lithography has several layers of product features, formed on top of one another. Where the parameter to be measured is overlay, each of the targets T1, T2 may for example comprise features formed in layers on top of one another.

Another form of overlay is that between different populations of features formed in a single layer. Such features may occur in a device being manufactured by a so called double-patterning processes (generally multiple-patterning). Techniques in this category include pitch-doubling, for example by litho-etch-litho-etch (LELE) and self-aligned dual-damascene in back end-of the line (BEOL) layers. In the multiple-patterning process, structures are formed in one layer of the product not in one patterning operation but in two or more patterning steps. Thus, for example, a first population of structures may be interleaved with a second population of structures, and the populations are formed in different steps, so as to achieve a higher resolution than one step alone can produce. While the placement of the populations should be identical and perfect in relation to other features on the substrate, of course every real pattern exhibits a certain positional offset. Any unintentional positional offset between the populations can be regarded as a form of overlay, and can be measured by analogous techniques to those disclosed herein. Additionally, overlay against features in an underlying or overlying layer can be different for each population when multiple populations of features are formed in a single layer, and overlay for each of these populations can be measured separately if desired. The targets and methods can also be adapted as desired to measure other parameters of the lithographic process, for example critical dimension (CD). For the purposes of explanation, it will be assumed in the following examples that overlay between features in two layers is the parameter of interest.

As illustrated schematically in FIG. 3, individual features forming target T1 are relatively large in size, compared to product features P. Individual features forming target T2 are the same or similar in size to product features P. Not seen in FIG. 3, the radiation spot formed by rays I2 of apparatus 104 may be larger in diameter than the illumination spot formed by rays I1 of apparatus 102. The area occupied by target T2 may therefore be larger than that occupied by target T1. The area occupied by target T2 may for example be two, three or four times the area occupied by target T1. An advantage of such a large area is that sufficient radiation for a good measurement can be collected more quickly. The X-ray metrology apparatus 104 can provide an accurate and absolute measurement of overlay, relatively unaffected by process variations, but the large targets T2 occupy too much space to be included at many locations, especially not within product areas. Targets T1 are small enough to be provided at relatively many locations across the substrate, including within product areas, but measurements from these targets are affected by process variations and do not necessarily represent the overlay present within the product features P. In the novel metrology system, a processing unit 106 processes signals from both types of targets using apparatuses 102, 104 together, to provide an accurate measurement of overlay at many points across the substrate.

Although for the sake of illustration FIG. 3 shows the first and second metrology apparatuses 102, 104 simultaneously measuring targets T1 and T2 on a substrate W, in practice the measurements can be conducted at different times and places. The targets T1 and T2 will be very small in practice compared with the size of substrate W, and many targets of each type will be formed on a real substrate. Each metrology apparatus 102 and 104 may be a substantial piece of equipment. Consequently, in a practical embodiment, it is likely that all the targets T1 will be measured while the substrate is within apparatus 102, and at a different time (either before or after) all targets T2 will be measured while the substrate is loaded within apparatus 104. The first and second metrology apparatus may be stand-alone devices or may be incorporated with one another in a common hardware system. One or both of the first and second metrology apparatuses may be integrated with either the lithographic apparatus LA itself or within the lithographic cell LC.

Concerning the implementation of the each metrology apparatus in more detail, in a first embodiment the first metrology apparatus 102 is a dark field imaging apparatus of the type mentioned in the introduction. However, it should be understood that the invention applicable to improve the accuracy of other types of small target metrology, for example using image-based targets.

Internal structures of apparatus 102 and target T1 will not be shown or described in detail here. Details of the structure and operation of suitable apparatus 102, as well as suitable designs of target T1, can be found in international patent applications WO 2009/078708 and WO 2009/106279 which documents are hereby incorporated by reference in their entirety. These targets can be smaller than the illumination spot and may be surrounded by product structures on a wafer. Multiple gratings can be measured in one image, using a composite grating target. Further developments of the technique have been described in published patent publications US20110027704A, US20110043791A, US20120044470A US20120123581A, US20130258310A, US20130271740A and WO2013178422. Any of these developments can be applied in the context of the apparatus 102 of the present disclosure, and the contents of all these applications are also incorporated herein by reference.

Briefly summarizing the operation of apparatus 102 for dark field overlay metrology, the ray of illumination I1 impinging on a grating within target T1 from an angle off the axis O gives rise to a zeroth order ray (solid line 0) and two first order rays (dot-chain line +1 and double dot-chain line −1). It should be remembered that, these rays are just one of many parallel rays covering the area of the substrate including metrology target grating T and possibly (with an overfilled small target grating) other features. Using illumination from the direction shown, only the +1 order is selected to form a dark field image of the grating. By changing the illumination direction, then the −1 order can be imaged separately. Capturing these two images and comparing them allows asymmetries in the grating to be detected and analyzed. Using two or more biased gratings (gratings with a known offset programmed into them, in addition to the unknown overlay error that is caused by the process), these asymmetry measurements can be converted to an overlay measurement OV1. The illustration in FIG. 3 shows only a grating with diffraction in the X direction. The same principle applies for measurement of an orthogonal grating (which causes diffraction in the Y direction). As an alternative, the substrate is rotated by 180°, rather than rotating the illumination angle. Because the detection is in the form of a dark field image, multiple gratings can be measured in a single step.

The second metrology apparatus 104 in an example embodiment is a transmissive small-angle X-ray scattering (T-SAXS) apparatus. Typically X-rays with energy higher than 13 keV or higher than 15 keV will be used, having a very short wavelength of less than 0.1 nm. Compact sources are readily available with various energies. At these wavelengths, a silicon substrate is transparent. With such short wavelength, silicon wafer is transparent and it is possible to measure the scatter pattern of a target (for example the diffraction pattern of a grating) through the wafer. T-SAXS techniques are widely used for analyzing materials, and suitable T-SAXS apparatuses are commercially available, for example from Xenocs (Grenoble, France; www.xenocs.com) or Bruker AXS GmbH (Karlsruhe, Germany; www.bruker.com). A T-SAXS apparatus applied to measurement of overlay is disclosed in US 2007224518A (Yokhin et al, Jordan Valley), and the content of that application are incorporated herein by reference. Illumination system 104a in that example comprises an X-ray source, an optical elements such as a monochromator and a collimator. The monochromator ensures a narrow range of wavelengths to be used, while the collimator ensures a narrow range of incidence angles to form the X-ray irradiation spot. The spot size may be tens of microns, for example between 20 and 200 μm in diameter. The spot size may be smaller Detection system 104b comprises primarily a position-sensitive X-ray detector, typically an array of detector elements. The array may be a linear array, but by providing a 2-dimensional array of elements (pixels), diffraction patterns in both X and Y directions can be captured simultaneously. A beam stop 104c is sometimes included to prevent the unscattered beam 108 from reaching the detector, so that (relatively weaker) rays scattered by the target can be detected reliably.

Reflective X-ray scattering apparatus are also available, These include for example, GI-SAXS, (where GI stands for grazing incidence) and high-reflectivity high-resolution X-ray crystallography. A paper by Yuri Shvyd'ko and others describes "High-reflectivity high-resolution X-ray crystal optics with diamonds" (Nature Physics 6, 196-199 (2010), Published online: 17 Jan. 2010|doi:10.1038/nphys1506). The Shvyd'ko paper confirms that high reflectance can be achieved at X-ray wavelengths, whereas normal materials would be penetrated. These reflective techniques could be adapted and used in principle to measure properties of periodic structures manufactured by a lithographic process, in addition to T-SAXS or instead of T-SAXS. For GI-SAXS, the irradiation spot tends to be much larger than is desired for a typical overlay target in semiconductor production. However, high-reflectivity X-ray techniques can function with a small spot as required.

The scattering angles resulting from the product-like feature dimensions and the X-ray wavelengths mean that several orders of diffraction can be detected. In the cases of an overlay target in the X-ray waveband the contribution of both layers is additive in terms of diffraction amplitudes and there is no coupling between the top and bottom layers. However, a perfectly aligned grating and a slightly misaligned one have different diffraction peak intensities. The diffraction envelope, meaning the overall shape of the diffraction pattern, will be different. By measuring the intensity of the diffraction orders it is possible to build an empirical model to link overlay and intensities. The model may be based only on the peak intensities, or it may take into account the shapes of the peaks, or of the whole spectrum. The detailed design of the model will depend on the nature of the targets, which property is to be measured, compromises in computing power, measurement time and so forth. The shape of the diffraction peaks may for example be used to obtain some information about the target such as disorder in the targets (line edge roughness, LER). This is done by a digital processing and comparison with measurements made for example by transmission electron microscopy (TEM) or optical CD metrology (OCD). It is also feasible to reconstruct the overlay targets by modeling the diffraction process explicitly. In X-ray scattering the cross-correlations between parameters such as CD, height and so on are negligible and the measurements are insensitive to process variations.

The diffraction process can be modeled as follows. Let A represents the diffracted amplitude for two gratings with features $f_1$ and $f_2$, at position $x_1$ and $x_2$. For diffraction order (h,0,0) for a monoperiodic ("1D-p") grating as used for overlay metrology, the amplitude is:

$$A = f_1 e^{2\pi x_1 h} + f_2 e^{2\pi x_2 h}$$

so that the diffraction intensity is:

$$I = |A|^2 = c + 2f_1 f_2 \cos(2\pi h(x_2 - x_1))$$

where c is a constant. Overlay ov is defined as $x_2 - x_1$. By shifting one grating by a half-pitch over the other, we get a sine-dependency between intensity and overlay:

$$I \propto 2f_1 f_2 \sin(2\pi h \, ov)$$

with h the order of an individual diffraction peak. Each diffraction order intensity can carry information about overlay.

The X-ray method is process robust and insensitive to non-patterned layers. It can provide an absolute overlay measurement, without relying on multiple biased targets. Multiple biased targets can be used if desired, however. However, it works best where there is a clear area for transmission where only the two gratings of interest (level 1 and level 2) are present. This is often the case for the "front-end" of the lithographic manufacturing process (FEOL) when only a few layers have been made. Commonly these front-end layers are also the ones with most critical specifications for parameters such as overlay. It is possible to have patterned structure in the X-ray path if they have a different pitch than the targets of interest. In principle, in that case it will be possible to differentiate the information coming for the overlay targets and from the background having a different periodicity. In general, however the presence of other structures will make in-die or in-product measurements more complex or not possible, and it will be preferred to have only the two structures of interest placed on top of each other.

Figure 4A:
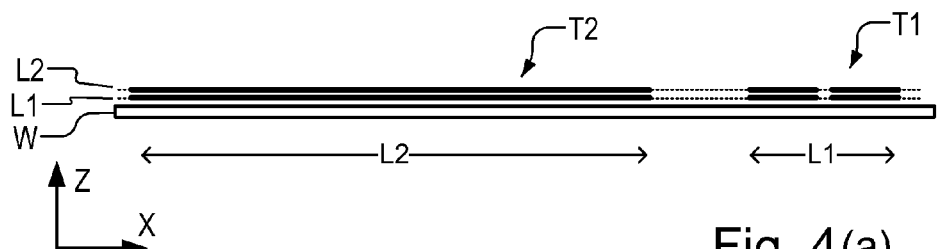
FIG. 4 shows (a) in schematic cross-section and (b) in plan view a pair of different targets suitable for use in the system of FIG. 3.
Figure 4B:
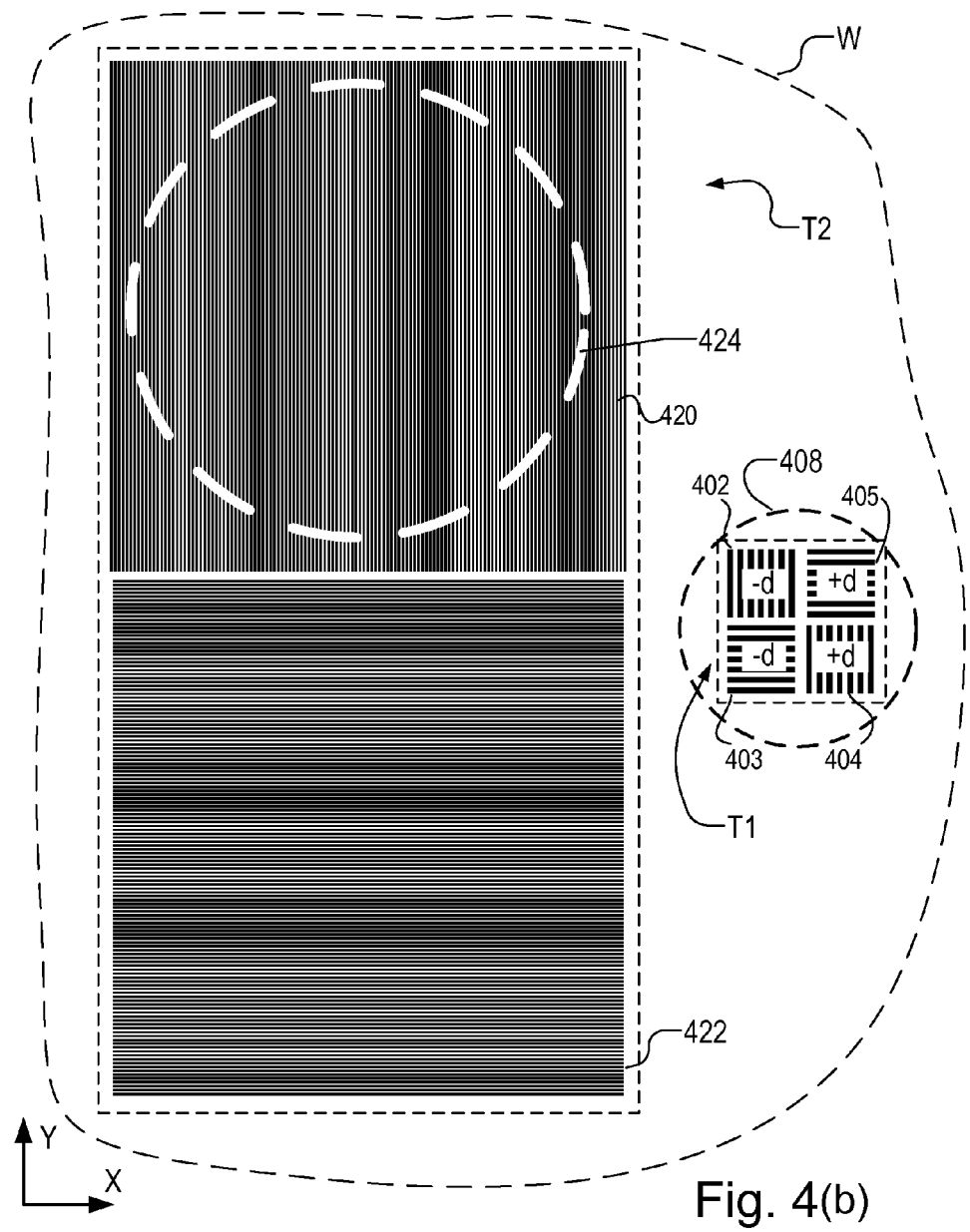

FIG. 4 depicts representative examples of metrology targets T1 and T2 on a substrate W. FIG. 4 (a) shows a cross-section shows schematically substrate W, to which lower and upper product layers L1 and L2 are added during the manufacturing process. It will be understood that the substrate carries product features (functional device structures), whose quality depends on careful control of overlay. A real product will have many layers in practice. FIG. 4(b) shows a plan view of the substrate in the region of these targets. As seen in the cross-section (a), these targets have grating features in both layers L1 and L2, although only the top layer features can be seen in the plan view.

The target T1 comprises in this example a composite target on the substrate, as known from the dark field overlay measurement technique. The composite target comprises four small gratings 402 to 405 positioned closely together so that they will all be within the measurement spot 408 formed by the illumination beam of the first metrology apparatus 102. Thus these four gratings are all simultaneously illuminated and simultaneously imaged on sensors. In an example dedicated to overlay measurement, gratings 402 to 405 are themselves formed by overlying gratings that are patterned in different layers of the semi-conductor device formed on substrate W. Gratings 402 to 405 are differently biased in order to facilitate measurement of overlay between the layers in which the different parts of the composite gratings are formed. In the present example, the gratings have different orientations. For example, X and Y gratings are schematically indicated in the target shown in FIG. 4, the X-direction gratings 402, 404 may have offsets +d and −d respectively, while the Y-direction gratings 403, 405 also have offsets of +d and −d. In another example, four gratings may have a single orientation, but with biases of +d, −d, +3d, −3d respectively. This "bias" means that one of the gratings has its components arranged so that if they were both printed exactly at their nominal locations one of the components would be offset relative to the other by a distance d. A second grating has its components arranged so that if perfectly printed there would be an offset of d but in the opposite direction to the first grating and so on. While four gratings are illustrated, a practical embodiment might use a larger number of gratings to obtain a desired accuracy.

A dimension L1 of the target T1 may be for example on the order of 10 μm, for example in the range 5 to 20 μm. First metrology apparatus 102 can resolve the different individual gratings 402 to 405 within dark field images formed on an image sensor Image processor and controller PU processes these images to identify the separate images of the gratings, for example by pattern matching techniques.

Once the separate images of the gratings have been identified, the intensities of those individual images can be measured, e.g., by averaging or summing selected pixel intensity values within the identified areas Intensities and/or other properties of the images can be compared with one another. Using different orientations or illumination directions, different measurements can be taken. These results can be combined to measure overlay as a parameter of the lithographic process.

Target T2 also comprises overlaid gratings formed in the layers L1 and L2, 420 and 422. In this illustrated example, one grating 420 is periodic in X and provides for overlay measurement in the X direction, while grating 422 is periodic in Y and provides for overlay to be measured in the Y direction. Second metrology apparatus 104 uses an irradiation spot represented by circle 424 to obtain a diffraction spectrum in detection system 104b, as described above and as (for example) disclosed in US 2007224518A. It will be noted that the target features (grating lines) in target T2 are much finer in pitch than features of target T1, although they not shown to scale. In particular, they can have dimensions identical or similar to those of the most critical product features P (not shown in FIG. 4 (b) but present on the substrate as illustrated in FIG. 3). In contrast, the grating features or other features of first target T1 are much larger than the product features. As an example, target T2 may have a periodic pattern with a pitch less than 50 nm in one or both directions. As an example, target T1 may have a periodic pattern with a pitch greater than 100 nm, for example greater than 400 nm.

It may be noted that the pitch and feature sizes referred to here concern the principal features of the targets. It is known that the principal features of a grating or other metrology target may themselves be sub-segmented for various reasons. Such sub-segmentation is provided for example to make the features more product-like in the exposure and etching process. Sub-segmentation has also been proposed for modulating the effective refractive index of the principal features, for example to approximate a sinusoidal grating. The optical metrology apparatus working at longer wavelengths is nevertheless "blind" to the sub-segmentation, and sees only the principal features.

Figure 5:
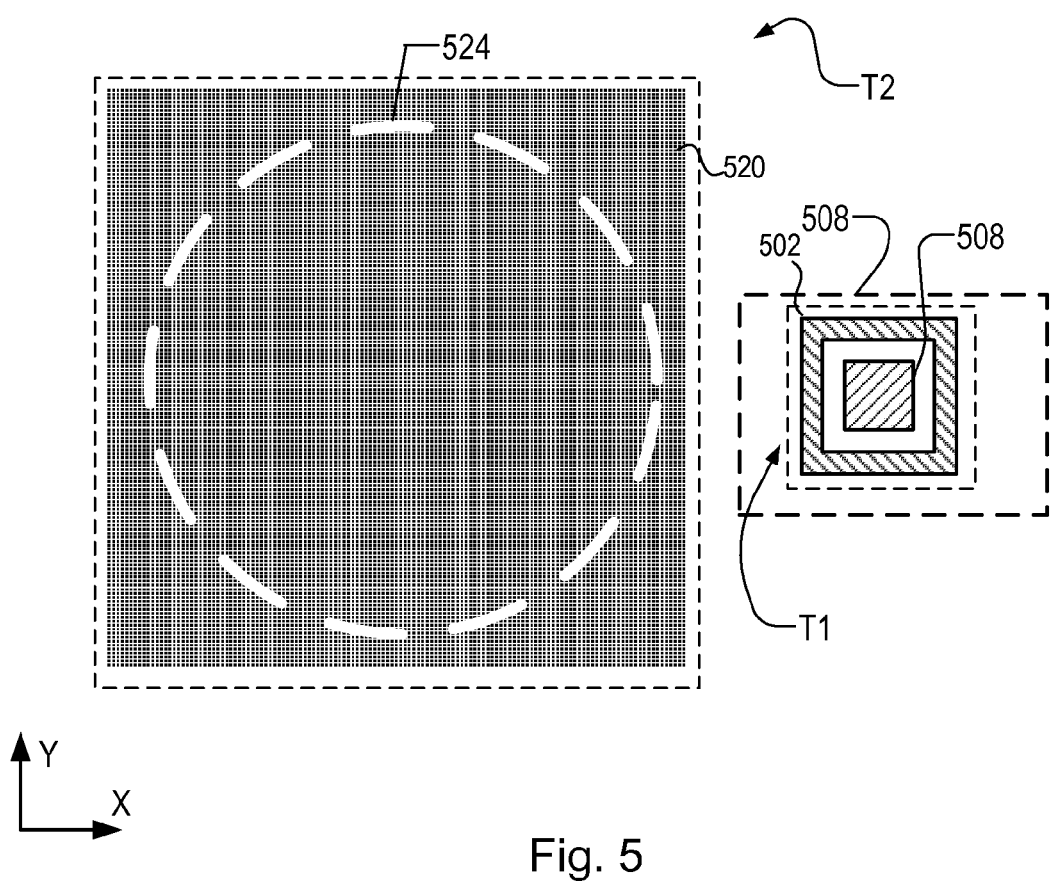
FIG. 5 shows in plan view an alternative pair of targets on a substrate in accordance with an alternative embodiment of the present invention.

FIG. 5 shows in plan view alternative forms of targets T1 and T2. The target T1 in this example has a "box-in-box" feature 502, 503, instead of gratings. One box-like feature 502 is formed in one layer while another feature 503 is formed in another layer. 508 represents the field of view of an image-based overlay metrology apparatus, which may be for example of the Archer™ manufactured by KLA-Tencor Corporation (www.kla-tencor.com). The features 502, 503 can be resolved separately in images captured by the apparatus, to measure overlay by determining whether inner feature 503 appears centrally or off-center relative to the outer feature 502. Various enhanced targets for image-based overlay metrology are disclosed in the paper "Optimized Overlay Metrology Marks: Theory and Experiment" by Adel et al, IEEE Transactions on Semiconductor Manufacturing, (Volume: 17, Issue: 2, May 2004, pages 166-179, DOI 10.1109/TSM.2004.826955). The box-in-box design illustrated in FIG. 5 is schematic only. As mentioned above, principal features such as the boxes labeled 502, 503 can be made up of smaller features (sub-segmented). The references to sizes of these features refer to the principal features illustrated. The optical metrology apparatus is "blind" to the subsegmentation.

Target T2 in this example comprises a two-dimensional (2-D) grating 520 is similar in size to one of the gratings 420, 422 in FIG. 4. The X-ray irradiation spot 524 is similar in size, but a suitable metrology apparatus 104 in this case can resolve diffraction patterns independently in both X and Y directions, with a single exposure. Features in the illustrated grating 520 are dots, with product-like dimensions, for example with a pitch of 50 nm in each direction. 2-D features of different forms can be envisaged, including box ad bar-like features of the types illustrated in US2007224518A, mentioned above. Note that the target T1 of FIG. 5 can be used in an embodiment together with the target T2 of FIG. 4 and vice versa.

In either embodiments of FIG. 4 and FIG. 5, it can be seen that target T2 also has a dimension L2 much greater than that of target T1. It may be for example 40 μm, or larger. It is preferred that the target is underfilled by the irradiation spot 424. With an appropriate collimator in the source system 104a, smaller targets could be achieved by reducing the size of the irradiation spot 424, for example as small as 10×10

μm. In that case, however, existing X-ray equipment requires a relatively long capture time to obtain an accurate diffraction spectrum. Increasing the spot size by providing a larger target is one way to obtain the necessary combination of accuracy and throughput. On the other hand, it is also important to measure overlay within the product areas (so-called "in-die" metrology), and small targets are important for that purpose (in-die real estate is very expensive).

The present disclosure therefore proposes a hybrid solution, combining X-ray measurement of large, product-like targets in non-product areas and optical metrology on small targets in product areas. By placing the large X-ray targets in the scribe-line juxtaposed next to a small target, X-ray measurements can be used to calibrate the optical small-target measurements and serve to translate overlay measured on "at resolution" features (say 50 nm pitch) and overlay measured on coarser targets (say 500 nm pitch). Thereby processing unit 106 can correct for the systematic bias between the overlay at coarse pitch and at the fine at-resolution pitches, that may be caused for example by differences in asymmetry sensitivity, and caused by different sensitivities related to aberrations in the projection system PS of the lithographic apparatus LA.

Figure 6:
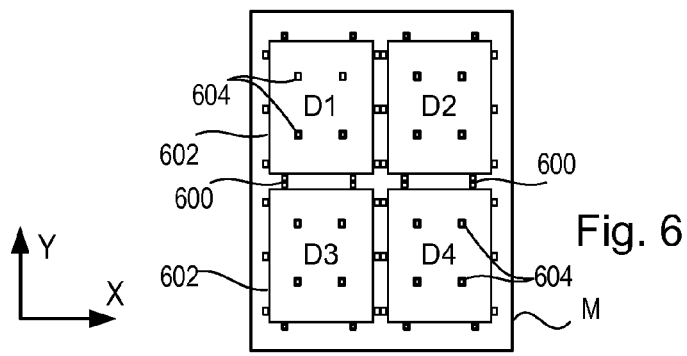
FIG. 6 illustrates general form of a patterning device having product areas, scribe lane areas and metrology targets in both the scribe lane and product areas.

FIG. 6 shows schematically the overall layout of a patterning device M supporting the hybrid technique just mentioned. Patterning device M may be for example a reticle. As mentioned already, metrology targets 600 may be included in a scribe lane portion of the applied pattern, between functional device pattern areas 602. As is well known, patterning device M may contain a single device pattern, or an array of device patterns if the field of the lithographic apparatus is large enough to accommodate them. The example in FIG. 6 shows four device areas labeled D1 to D4. Scribe lane targets 600 are placed adjacent these device pattern areas and between them. On the finished substrate, such as a semiconductor device, the substrate W will be diced into individual devices by cutting along these scribe lanes, so that the presence of the targets does not reduce the area available for functional device patterns. Where targets are small in comparison with conventional metrology targets, they may also be deployed within the device area, to allow closer monitoring of lithography and process performance across the substrate. Some in-die targets 604 of this type are shown in device area D1. While FIG. 6 shows the patterning device M, the same pattern is reproduced on the substrate W after the lithographic process, and consequently this the description applies to the substrate W as well as the patterning device.

Figure 8:
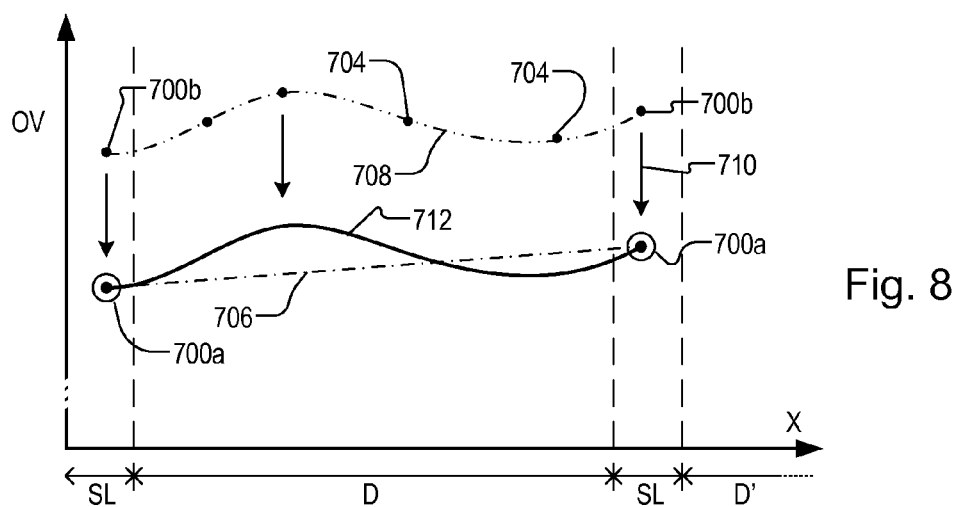
FIG. 8 illustrates the principle of combining measurement results obtained from large and small targets formed on a substrate exposed using the patterning device of FIG. 7 to obtain more accurate measurements, in an embodiment of the present invention.

In order to improve the performance and density of overlay measurements without sacrificing in-product real-estate, the scribe-lane targets 600 and in-die targets 604 of FIG. 8 are based on a hybrid of the small (optical) targets T1 and the large (X-ray) targets T2, as will now be described.

Figure 7:
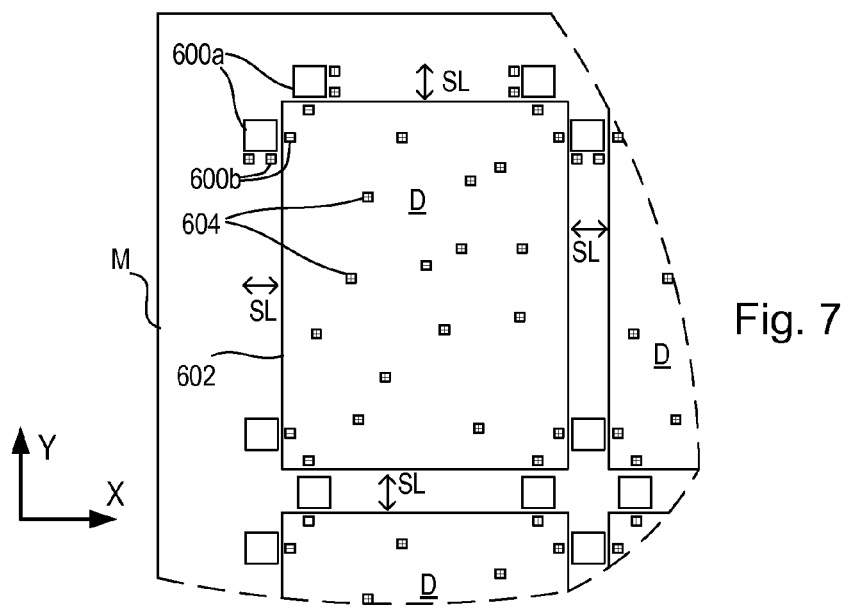
FIG. 7 illustrates more detail of an embodiment of the patterning device of FIG. 6, according to the present invention.

FIG. 7 shows in more detail one of the product areas 602 on the patterning device M, showing the targets 600 and 604 in more detail. The same pattern is produced and repeated at each field on the substrate during the lithographic process. Product areas are labeled D and scribe-line areas are labeled SL. In the product areas 602, small targets 604 are spread with a desired density at different locations among the product features. These targets 604 have, for example, the form of target T1 illustrated in FIG. 4 or 5, and can be measured using the first metrology apparatus 102 of the metrology system of FIG. 3. In the scribe-lane areas SL, large targets 600*a*, for example of the type T2 illustrated in FIG. 4 or 5, are provided that can be measured using the second metrology apparatus 104 using X-rays. Beside each of the large targets 600*a* is provided one or more small targets 600*b*, however, which may be in the scribe-lane areas SL or just inside the product area 602. Where each target comprises a group of two or more individual gratings, the individual gratings of the small and large targets could be positioned among the gratings of the large target, rather than being wholly separate. The small targets 600*b* are identical in form to the small targets 604 which are distributed over the product area 602. With this combination of targets, the large scribe-lane targets 600*a* can be used to measure a lower order of model for overlay with high accuracy, while the small in-product targets 604 can be measured with high density, and modeled as a perturbation of the lower order model. Since the regular targets 600*a* are accompanied by smaller targets 600*b* close by, inaccuracies caused by, for example, process dependency in the measured overlay using small targets can be known and compensated.

In the language of the introduction and claims, it will be seen from FIG. 7 that the targets provided on the substrate comprise a first set of targets of the type T1, and a second set of targets of the type T2. A first subset of the first set of targets (targets 600*b*) are distributed substantially at first locations across the substrate where targets of the second set (600*a*) are also located. A second subset of the first set of targets (604) are distributed at second locations additional to the first locations.

FIG. 8 illustrates graphically the novel, hybrid measurement concept described above, and the processing implemented by processing unit 106 in the metrology system of FIG. 3. The horizontal axis X represents one dimension across the substrate. The product area D and scribe-lane areas SL are delimited on this axis. The vertical axis represents measured overlay values OVL. Two circled points labeled 700*a* are plotted to show overlay values measured the large targets 600*a*. Overlay values measured using the small targets 600*b* adjacent to the large targets are labeled 700*b*, and overlay values measured across the product area using the small targets 604 are labeled 704. Applying, for the sake of example, a simple linear model to the overlay across this product area, a profile curve 706 in single dot-dash line can be plotted between the points 700*a*. This curve or can be regarded as having a high accuracy where the overlay is sampled at points 700*a*, but has no fine detail in the product area in between. Another profile curve 708 (double dot-dash line) is plotted from the small target measurements 700*b* and 704. This higher order profile obviously contains far more detail in the X direction, but its measured overlay value is known to be subject to errors due to process dependency and limitations of the measuring instrument. Knowing that the targets 600*b* and 600*a* are positioned substantially at the same point on the substrate, however, an assumption can be made that the true overlay value represented by point 700*b* on the graph is more accurately represented by the value of point 700*a*. An offset 710 can therefore be calculated, and applied to all the points 704 so that the detail from the curve 708 can be applied as a perturbation of the straight line 706, to obtain a curve 712, which has both absolute accuracy and detailed structure across the product area.

While the simplified illustration of FIG. 8 shows only one dimension, the skilled reader will appreciate that the measurements and models extend in both the X and Y directions. Overlay in X and Y directions can also be separately modeled across this two-dimensional area. Similarly, while the curve 706 is a linear model between just two sample points, a real substrate will have a number of measurements 700*a* which can be joined with a higher order model, again in two dimensions. This linear interpolation might work well, for example in a scanning type lithographic apparatus, when the impact of imaging effects on overlay varies linearly over the illumination slit. Another alternative is to measure variation along the bottom scribe-lane using additional large & small target pairs. These allow the apparatus to capture higher-order behavior along the slit. In either case, the addition of perturbations from the curve 708 allows yet higher orders, particularly showing in-product variations, to be added to the model, without sacrificing the area required for a large X-ray target, or sacrificing the throughput required to use a smaller X-ray target. The overlay values can be analyzed in a number of ways. For example, the processor 106 can separate out perturbations which are common to all fields of the substrate from those which vary across the substrate as a whole. Thus, an intra-field overlay fingerprint can be separated from an inter-field overlay fingerprint.

Figure 9:
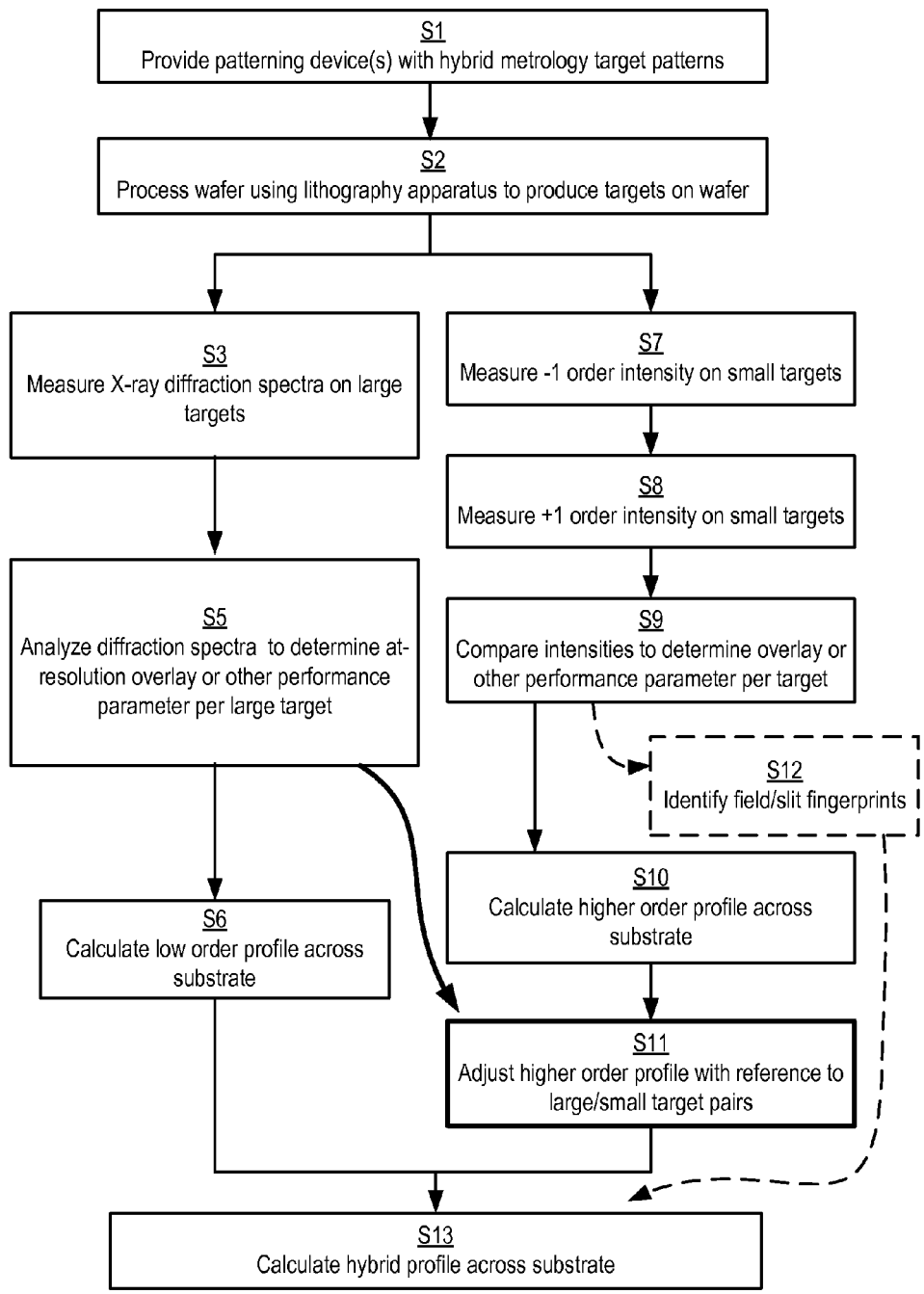
FIG. 9 is a flow chart illustrating a metrology method according to an embodiment of the present invention.

FIG. 9 is a flowchart showing an example of the overall process for measuring a parameter of a lithographic process, such as overlay, in the metrology system of FIG. 3. The process uses the combination of X-ray targets relatively sparsely distributed across the substrate, and smaller optical targets that are more densely distributed. At step S1 a patterning device (reticle) or set of patterning devices is provided with target patterns such as those illustrated in FIGS. 4 and 5 distributed around and within product pattern areas 602. The layout of the targets may be similar to that shown in FIG. 8, for example. Where the targets are for measuring overlay, patterns for making the targets will be included in at least two different reticles, which define patterns in different layers L1, L2 of the semiconductor or other product. Where the reticle is replaced by a programmable patterning device, the patterns are provided in data form, but the process is essentially the same. At S2, the metrology targets and product features are formed on the field areas of a substrate using a lithographic process. Of course a series of substrates will be patterned in practice, repeating step S2 and subsequent steps. The following steps are illustrated and described in a certain order, but can be performed in various orders without departing from the principles of the process.

The patterned substrate is then loaded into metrology apparatus such as those forming the metrology system 100 of FIG. 3. Steps S3 and S5 relate to measurement of overlay on the large targets 600a in the second (X-ray) metrology apparatus 104. At S3 the diffraction spectrum of each target (and each grating within the target, where multiple gratings are provided) is captured using small angle X-ray scattering. At S5 the spectra are processed to derive a measure, in one or more targets 600a. At S6 the measured large target overlay values are combined into a low-order profile of overlay across the substrate, represented by the curve 706 in FIG. 10.

At S7 and S8, assuming a dark field imaging technique, the small targets 600b and 604 across the substrate are measured with −1 order and +1 order diffracted radiation respectively. Using the FIG. 3 scatterometer, purely as an example, these measurements would be done with the dark field imaging branch and sensor 23, as described in the prior applications. For each target and each grating within the target, the two measured intensities are compared at step S9 to obtain an overlay measurement for each small target. At S10, these can be combined to define a higher-order profile of overlay across the substrate, similar to curve 708 in FIG. 8. Where the first metrology apparatus is of a different type, for example an image-based metrology apparatus, different steps S7 to S9 may be performed to obtain the overlay measurement from the small targets.

At S11, the low order and higher order profiles from steps S6 and S11 are merged, using the knowledge that small optical targets 600b are adjacent to large product-like targets 600a, to produce a hybrid profile (i.e. curve 712 in FIG. 8). The manner in which the data from the two types of target are combined is not critical, and they may in fact be stored separately but with cross-references and adjustments made, when they are used. The principle is that the parameter (overlay for example) measured using the small targets can be corrected by reference to an offset observed between the small and large targets, which are adjacent one another.

As mentioned above, the profile of overlay and other parameters does not need to be expressed entirely as a variation across the substrate. It can be expressed for example as an intrafield profile that is common to all fields (each instance of patterning using the patterning device M at a different location on the substrate W) and a lower order, interfield, variation onto which the intrafield variation is repeatedly superimposed.

Assuming that the profile of overlay errors does indeed have a strong intrafield component that is substantially the same for every field, a shortened measurement process can be implemented, as illustrated by the step S12 in broken lines. In this modified embodiment of the process, the small targets 600b, 604 are all measured only for a few representative fields, sufficient to determine and record the intrafield profile and the offset 710. The intrafield variations can then be superimposed on the lower order interfield profile for all fields of the substrate, without measuring all the small targets across the substrate. Of course this embodiment assumes that the intrafield profile is sufficiently repeating, which will need to be verified by experiment for each process. The benefit is that the cost in time and measurement throughput is not so great as in a process where all the small targets are measured. Similarly, the correction to be applied between small and large target measurements may be constant across the substrate, and therefore predictable from a few comparisons only. Then, to improve throughput, only a subset of the provided targets need actually to be measured. Alternatively, experiment may reveal that the correction is quite variable, and should itself be modeled as a parameter variable from field to field.

While space in the scribe-lanes is not as expensive as space within the product areas, it is still expensive and it may be desirable to reduce the size of the X-ray targets 600a having the product-like features. Smaller targets for example 10×10 µm can be provided, at the penalty of throughput. Each target in that case may take a few seconds to measure (although X and Y directions can be measured in a single exposure). If only a few targets need to be measured, the throughput penalty associated with a small X-ray target may be acceptable. With forthcoming brighter X-ray sources, acquisition time per target may reduce to below one second, or lower if the reduction in accuracy still gives accuracy high enough for the desired overlay performance to be measured. However, for the foreseeable future, there will always be a time penalty associated with the X-ray measurements compared to the relatively rapid optical measurements.

Figure 10:
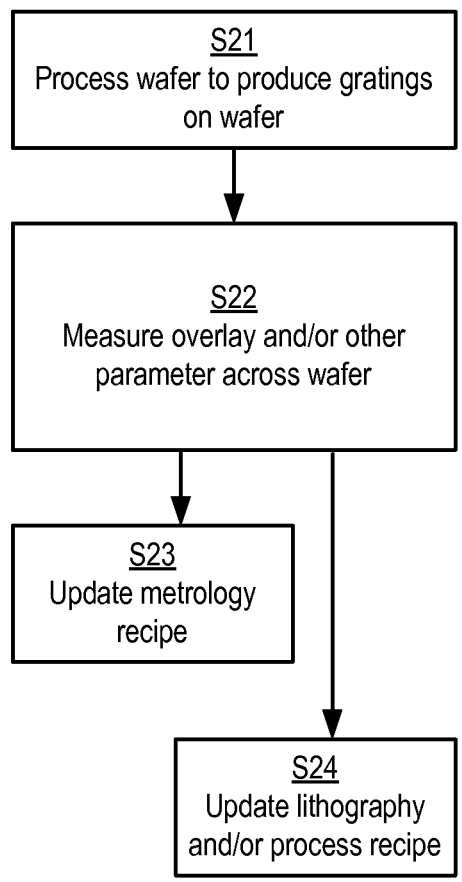
FIG. 10 is a flow chart illustrating a method of controlling performance of an inspection method and/or of a lithographic manufacturing process using measurements made by the method of FIG. 9.

FIG. 10 is a flowchart illustrating a manufacturing process in which the metrology system of FIGS. 3 and 10 and suitable patterning devices and substrates are used to monitor performance, and as a basis for controlling metrology and/or production processes. In step S21, wafers are processed to produce product features and metrology targets including both small optical targets and X-ray targets, as described above. At step S22, overlay and/or other parameters are measured and calculated using the method of FIG. 10. At step S23, the measured parameter is used (together with other information as may be available), to update a metrology recipe. A metrology recipe may define for example what wavelength(s) and/or what polarizations of light should be uses to illuminate a target, or what angle of incident ray I1. The updated metrology recipe is used for re-measurement of overlay, and/or for measurement of overlay on subsequently processed wafers. In this way, calculated overlay measurements are improved in accuracy. The updating process can be automated if desired.

In step S24, the knowledge of at resolution overlay that is gained by combination of the measurements from the first and second metrology apparatuses is used to update recipes that control the lithographic patterning step and/or process steps in the device manufacturing process, for processing of further wafers. Again this updating can be automated if desired.

While specific embodiments of the invention have been described above, it will be appreciated that the invention may be practiced otherwise than as described. In association with the novel targets as realized on substrates and patterning devices, an embodiment may include a computer program containing one or more sequences of machine-readable instructions describing a methods of producing targets on a substrate, measuring targets on a substrate and/or processing measurements to obtain information about a lithographic process. This computer program may be executed for example within unit PU in the apparatus of FIG. 3 and/or the control unit LACU of FIG. 2. There may also be provided a data storage medium (e.g., semiconductor memory, magnetic or optical disk) having such a computer program stored therein.

Although patterning devices in the form of a physical reticle have been described, the term "patterning device" in this application also includes a data product conveying a pattern in digital form, for example to be used in conjunction with a programmable patterning device.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used in relation to the lithographic apparatus encompass all types of electromagnetic radiation, including ultraviolet (UV) radiation (e.g., having a wavelength of or about 365, 355, 248, 193, 157, or 126 nm) and extreme ultra-violet (EUV) radiation (e.g., having a wavelength in the range of 5-20 nm), as well as particle beams, such as ion beams or electron beams.

The term "lens," where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A substrate comprising:
   product features; and
   metrology targets configured to be used in measurement of a parameter of performance of a lithographic process used to form the product features and the metrology targets on the substrate, the metrology targets comprising:
   a first set of targets configured to be used in the measurement of the parameter using radiation having a wavelength longer than 150 nm and comprising:
   a first feature greater in size than smallest of the product features,
   a first subset of targets distributed across a first location, and
   a second subset of targets distributed across a second location; and
   a second set of targets, distributed across the first location, configured to be used in the measurement of the parameter using X-radiation and comprising a second feature substantially equal in size to the smallest of the product features.

2. The substrate of claim 1, wherein:
   the product features are arranged in product areas separated by scribe lanes;
   the first location is within the scribe lanes; and
   the second location is within the product areas.

3. The substrate of claim 1, wherein:
   each target of the first set of targets comprises a first area; and
   each target of the second set of targets comprises a second area, the first area being smaller than half of the second area.

4. The substrate of claim 1, wherein:
   each target of the first set of targets comprises a first area smaller than about 16×16 μm or smaller than about 10×10 μm; and
   each target of the second set of targets comprises a second area greater than about 20×20 μm or greater than about 30×30 μm.

5. The substrate of claim 1, wherein:
   the parameter is an overlay; and
   each target of the first set of targets or the second set of targets is an overlay target formed in two or more patterning steps.

6. A patterning device comprising:
   product pattern features configured to be used to form product features on a substrate; and
   target pattern features configured to be used to form a first and second set of targets on the substrate, wherein:
the first set of targets are configured to be used in measurement of a parameter using radiation having a wavelength longer than about 150 nm; and
the second set of targets are configured to be used in the measurement of the parameter using X-radiation.

7. The patterning device of claim 6, wherein the target pattern features are configured to be used to form an overlay grating.

8. A method of measuring a parameter of performance of a lithographic process used to form product features on a substrate, the method comprising:
forming metrology targets on the substrate, the metrology targets comprising:
a first set of targets comprising:
a first subset of targets distributed across a first location, and
a second subset of targets distributed across a second location; and
a second set of targets distributed across the first location;
illuminating the first subset of targets with radiation of wavelength longer than about 150 nm;
illuminating the second set of targets with X-radiation;
detecting radiation diffracted or reflected by the first subset of targets and the second set of targets;
determining a first value for the parameter corresponding to the first location based on the radiation detected from the first subset of targets;
determining a second value for the parameter corresponding to the first location based on the radiation detected from the second set of targets; and
correcting the first value of the parameter based on a comparison between the first and second values.

9. The method of claim 8, further comprising:
illuminating the second subset of targets with radiation of wavelength longer than about 150 nm;
detecting radiation diffracted or reflected by the second subset of targets; and
determining a third value of the parameter corresponding to the first location based on the radiation diffracted from the second subset of targets and the corrected first value of the parameter.

10. The method of claim 8, wherein:
the product features are arranged in product areas separated by scribe lanes;
the first location is within the scribe lanes; and
the second location is within the product areas.

11. The method of claim 8, wherein:
each target of the first set of targets comprises a first area; and
each target of the second set of targets comprises a second area, the first area being smaller than half of the second area.

12. The method of claim 8, wherein:
the parameter is an overlay; and
each target of the first set of targets or the second set of targets is an overlay target formed in two or more patterning steps.

13. A device manufacturing method comprising:
transferring functional device patterns and metrology target patterns from a patterning device onto a substrate using a lithographic process, the transferring of the metrology target patterns comprising:
transferring a first pattern of the metrology target patterns, the first pattern having a first feature greater in size than a smallest feature of the functional device patterns, and
transferring a second pattern of the metrology target patterns, the second pattern having a second feature substantially equal in size to the smallest feature of the functional device patterns;
illuminating the first pattern of the metrology target patterns with radiation of wavelength longer than about 150 nm;
illuminating the second pattern of the metrology target patterns with X-radiation;
detecting radiation reflected from the metrology target patterns;
determining a value for one or more parameters of the lithographic process based on the detected radiation; and
applying a correction in subsequent operations of the lithographic process based on the determined value.

14. The device manufacturing method of claim 13, wherein:
the functional device patterns define product features arranged in product areas separated by scribe-lanes;
the first location is within the scribe lanes; and
the second location is within the product areas.

* * * * *